US011557588B2

(12) United States Patent
Pala et al.

(10) Patent No.: US 11,557,588 B2
(45) Date of Patent: Jan. 17, 2023

(54) MULTI-TRANSISTOR DEVICE INCLUDING FIRST AND SECOND LDMOS TRANSISTORS HAVING RESPECTIVE DRIFT REGIONS SEPARATED IN A THICKNESS DIRECTION BY A SHARED RESURF LAYER

(71) Applicant: Maxim Integrated Products, Inc., San Jose, CA (US)

(72) Inventors: Vipindas Pala, San Jose, CA (US); Vijay Parthasarathy, Sunnyvale, CA (US); Badredin Fatemizadeh, Palo Alto, CA (US); Marco A. Zuniga, Berkeley, CA (US); John Xia, Fremont, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 108 days.

(21) Appl. No.: 17/215,802

(22) Filed: Mar. 29, 2021

(65) Prior Publication Data
US 2021/0217748 A1    Jul. 15, 2021

Related U.S. Application Data

(63) Continuation of application No. 16/279,268, filed on Feb. 19, 2019, now Pat. No. 10,964,694.
(Continued)

(51) Int. Cl.
*H01L 27/088* (2006.01)
*H01L 21/8234* (2006.01)
(Continued)

(52) U.S. Cl.
CPC .... *H01L 27/088* (2013.01); *H01L 21/823418* (2013.01); *H01L 21/823462* (2013.01);
(Continued)

(58) Field of Classification Search
CPC .......... H01L 27/088; H01L 21/823418; H01L 29/0623; H01L 29/063; H01L 29/0634
(Continued)

(56) References Cited

U.S. PATENT DOCUMENTS 9,941,350 B1 * 4/2018 Lin .................. H01L 21/28537
2004/0201061 A1 * 10/2004 Jeon .................... H01L 29/0634
257/E29.066
(Continued)

FOREIGN PATENT DOCUMENTS

WO    WO 2012/098179 A1    7/2012

OTHER PUBLICATIONS

Chinese Patent Application No. 201910123703.6, First Office Action dated Jun. 4, 2021, 7 pages.
(Continued)

*Primary Examiner* — Matthew E. Gordon
(74) *Attorney, Agent, or Firm* — Lathrop GPM LLP

(57) ABSTRACT

A multi-transistor device includes first and second lateral double-diffused metal-oxide-semiconductor field effect (LDMOS) transistors sharing a first p-type reduced surface field (RESURF) layer and a first drain n+ region. In certain embodiments, the first LDMOS transistor includes a first drift region, the second LDMOS transistor includes a second drift region, and the first and second drift regions are at least partially separated by the first p-type RESURF layer in a thickness direction.

12 Claims, 9 Drawing Sheets

Related U.S. Application Data

(60) Provisional application No. 62/632,642, filed on Feb. 20, 2018.

(51) Int. Cl.
  *H01L 29/08* (2006.01)
  *H01L 29/06* (2006.01)
  *H01L 29/78* (2006.01)
  *H01L 27/06* (2006.01)

(52) U.S. Cl.
  CPC ........ *H01L 27/0688* (2013.01); *H01L 29/063* (2013.01); *H01L 29/0873* (2013.01); *H01L 29/7816* (2013.01)

(58) Field of Classification Search
  USPC ........................................................ 257/337
  See application file for complete search history.

(56) References Cited

U.S. PATENT DOCUMENTS

| | | |
|---|---|---|
| 2010/0032757 A1 | 2/2010 | Pendharkar |
| 2014/0070315 A1 | 3/2014 | Levy et al. |

OTHER PUBLICATIONS

Chinese Patent Application No. 201910123703.6, First Office Action dated Jun. 4, 2021, 8 pages.

* cited by examiner

US 11,557,588 B2

MULTI-TRANSISTOR DEVICE INCLUDING FIRST AND SECOND LDMOS TRANSISTORS HAVING RESPECTIVE DRIFT REGIONS SEPARATED IN A THICKNESS DIRECTION BY A SHARED RESURF LAYER

RELATED APPLICATIONS

This application is a continuation of U.S. patent application Ser. No. 16/279,268, filed Feb. 19, 2019, which claims benefit of priority to U.S. Provisional patent Application Ser. No. 62/632,642, filed Feb. 20, 2018, which is incorporated herein by reference.

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for use in high-frequency applications. Additionally, MOSFETS are relatively simple to control because they are voltage-controlled, instead of current-controlled, devices.

Lateral double-diffused metal-oxide-semiconductor field effect transistors, often referred to as LDMOS transistors, are a class of MOSFETS where drain-to-source voltage is supported within the transistors' semiconductor material primarily in a lateral direction. LDMOS transistors are often combined with other circuitry in integrated circuits, especially in power applications or radio-frequency applications.

FIG. 1 is a cross-sectional view of a prior art n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a polysilicon layer 117, and a silicon dioxide layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed on p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage VDS is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124 referred to as a drift region 134 to carry the majority of voltage VDS, thereby enabling LDMOS transistor 100 to support a relatively large value of VDS without breakdown.

A positive voltage $V_{GS}$ applied between gate electrode 116 and source electrode 104 creates negative charges in silicon semiconductor structure 102 under silicon dioxide layer 118, causing a minority-carrier channel to form in a region 136 of p-body 126. This channel has excess electrons and will therefore conduct current. Consequentially, current will flow in the lateral 138 direction through silicon semiconductor structure 102 from drain n+ region 132 to source n+ region 130 when $V_{GS}$ exceeds a threshold value and $V_{DS}$ is a positive value.

DETAILED DESCRIPTION OF THE EMBODIMENTS

Figure 1:
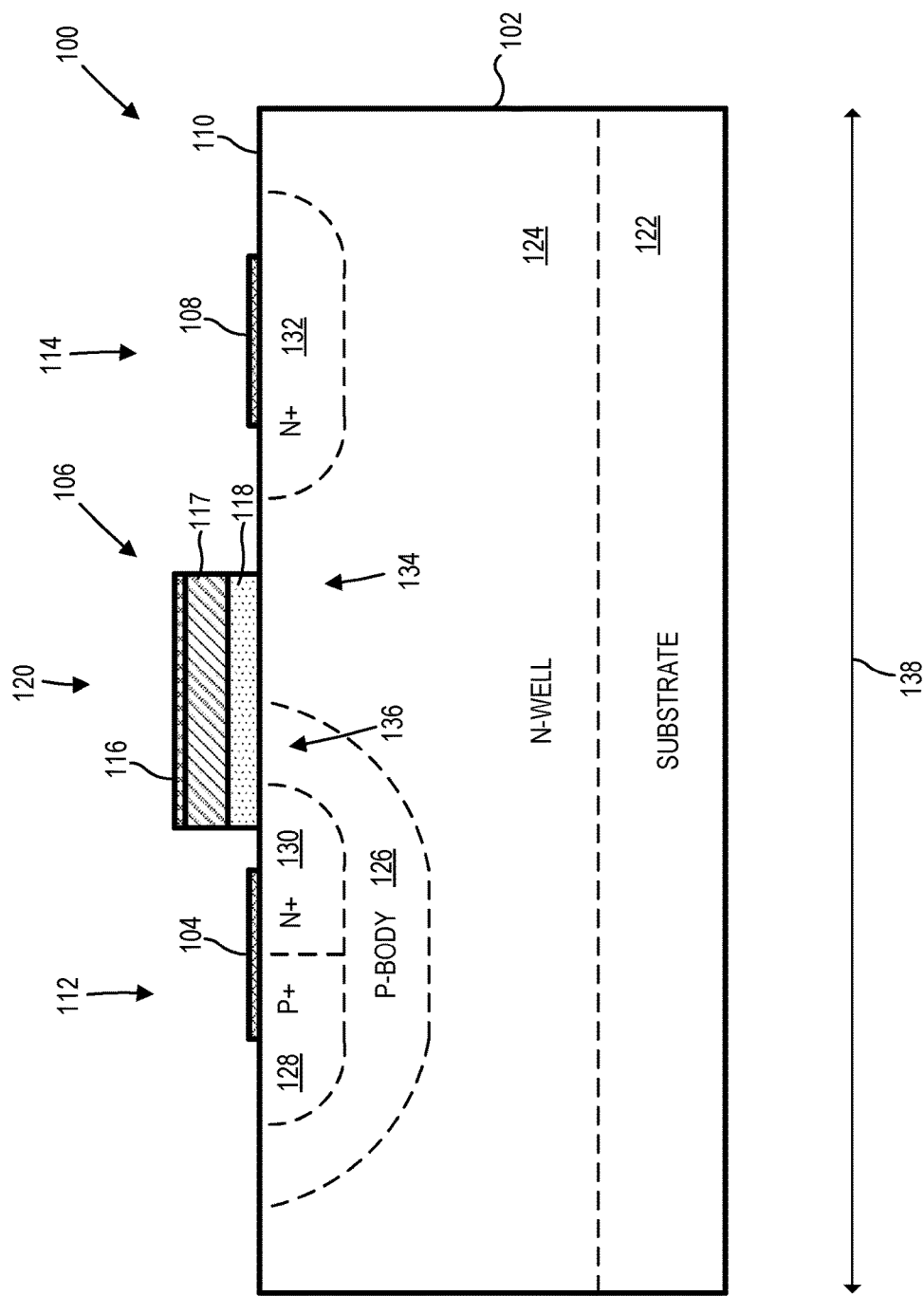
FIG. 1 is a cross-sectional view of a prior-art LDMOS transistor.
Figure 2:
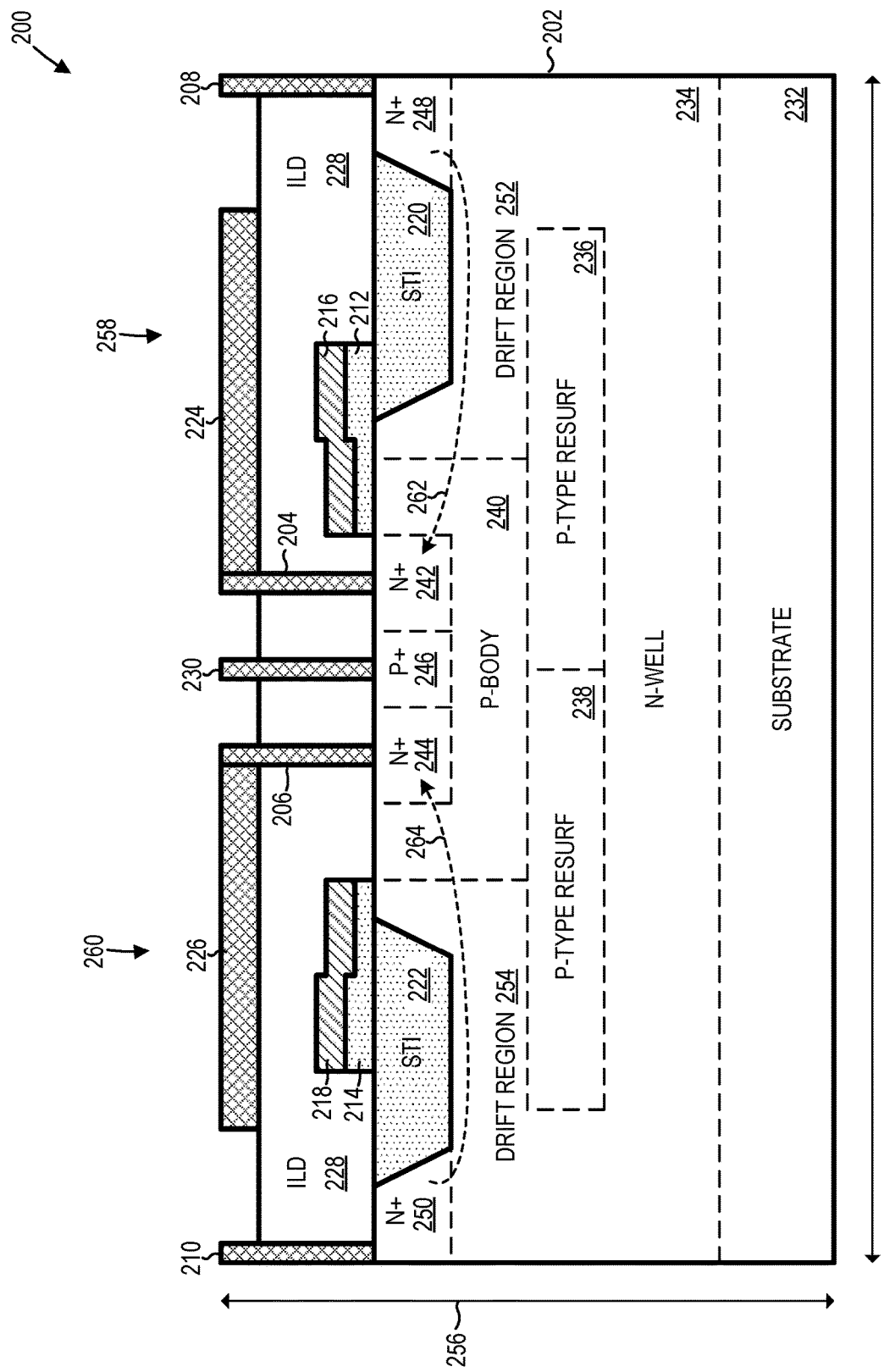
FIG. 2 is a cross-sectional view of a transistor device including dual LDMOS transistors.

Dual LDMOS transistor devices have been developed. For example, FIG. 2 is a cross-sectional view of a dual LDMOS transistor device 200 including a silicon semiconductor structure 202, a first source electrode 204, a second source electrode 206, a first drain electrode 208, a second drain electrode 210, a first gate dielectric layer 212, a second gate dielectric layer 214, a first gate conductive layer 216, a second gate conductive layer 218, a first shallow trench isolation (STI) region 220, a second STI region 222, a first conductive field plate 224, a second conductive field plate 226, an inner-layer dielectric (ILD) 228, and a body electrode 230.

Silicon semiconductor structure 202 includes a substrate 232, an n-well 234, a first p-type reduced surface field (RESURF) layer 236, a second p-type RESURF layer 238, a p-body region 240, a first source n+ region 242, a second source n+ region 244, a source p+ region 246, a first drain n+ region 248, and a second drain n+ region 250. N-well 234 is formed on substrate 232, and first and second p-type RESURF layers 236 and 238 are formed in N-well 234. P-body region 240 is formed in n-well 234 over first and second p-type RESURF layers 236 and 238. First source n+ region 242, second source n+ region 244, and source p+ region 246 are formed in p-body region 240. First source electrode 204 contacts first source n+ region 242, second source electrode 206 contacts second source n+ region 244, and body electrode 230 contacts source p+ region 246. First drain electrode 208 contacts first drain n+ region 248, and second drain electrode 210 contacts second drain n+ region 250. N-well 234 includes a first drift region 252 and a second drift region 254.

First gate dielectric layer 212 and first gate conductive layer 216 are stacked on silicon semiconductor substrate 202 in a thickness 256 direction, and second gate dielectric layer 214 and second gate conductive layer 218 are stacked on silicon semiconductor substrate 202 in the thickness 256 direction. ILD 228 is disposed over silicon semiconductor structure 202 in the thickness 256 direction, and each of first conductive field plate 224 and second conductive field plate 226 are disposed over ILD 228 in the thickness 256 direction.

Transistor device 200 includes first and second LDMOS transistors 258 and 260. First LDMOS transistor 258 includes n-well 234, first p-type RESURF layer 236, p-body region 240, p+ source region 246, first n+ source region 242, first STI region 220, first n+ drain region 248, first gate dielectric layer 212, first gate conductive layer 216, ILD 228, first source electrode 204, first drain electrode 208, and first conductive field plate 224. Second LDMOS transistor 260 includes n-well 234, second p-type RESURF layer 238, p-body region 240, p+ source region 246, second n+ source region 244, second STI region 222, second n+ drain region 250, second gate dielectric layer 214, second gate conductive layer 218, ILD 228, second source electrode 206, second drain electrode 210, and second conductive field plate 226. Thus, n-well 234, p-body 240, source p+ region 246, and ILD 228 are shared between first and second LDMOS transistors 258 and 260. During forward conduction of first LDMOS transistor 258, current flows from first drain n+ region 248 to first source n+ region 242, as symbolically shown by arrow 262. During forward conduction of second LDMOS transistor 260, current flows from second drain n+ region 250 to second source n+ region 244, as symbolically shown by arrow 264.

Applicant has developed multi-transistor devices where two LDMOS transistors share a common p-type RESURF layer and a common drain region. Certain embodiments of these multi-transistor devices advantageously have a greater linear current density ($ID_{LIN}$) and a smaller specific ON-resistance than conventional LDMOS multi-transistor devices.

Figure 3:
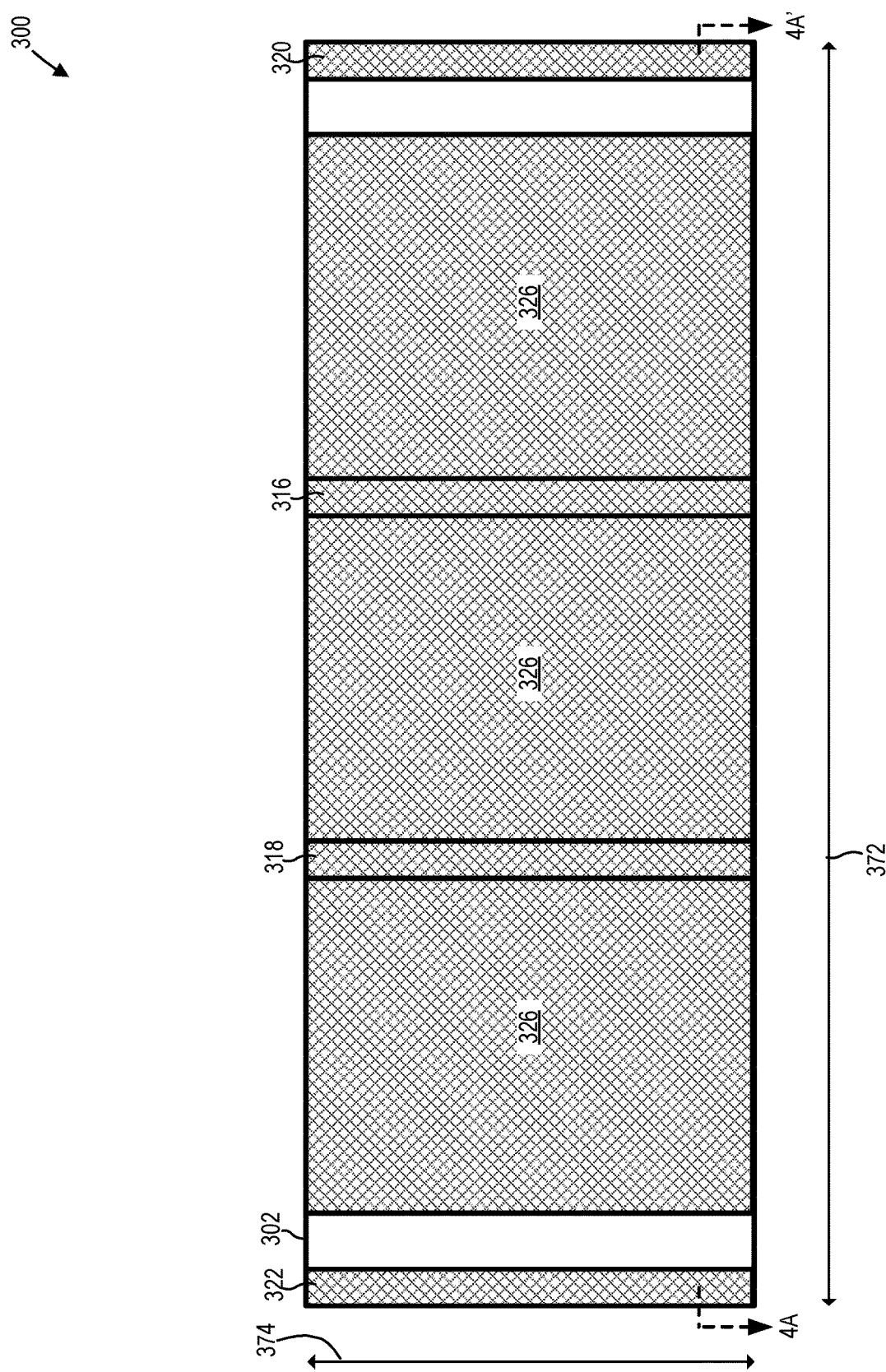
FIG. 3 is a top plan view of a multi-transistor device, according to an embodiment.
Figure 4:
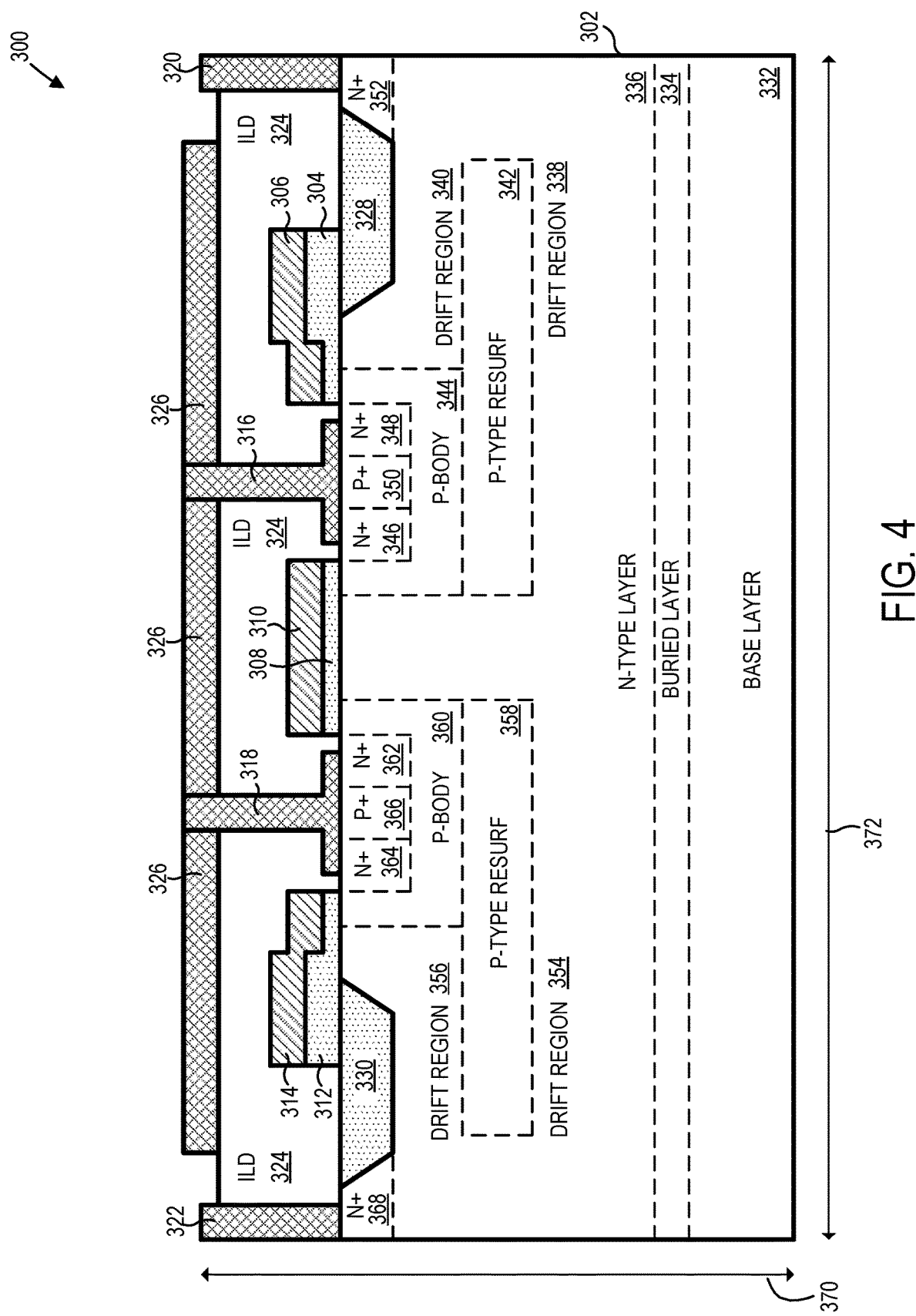
FIG. 4 is a cross-sectional view of the FIG. 3 multi-transistor device taken along line 4A-4A' of FIG. 3.

FIG. 3 is a top plan view of a multi-transistor device 300, which is one embodiment of the new multi-transistor devices. FIG. 4 is a cross-sectional view of multi-transistor device 300 taken along line 4A-4A' of FIG. 3. Multi-transformer device 300 includes a silicon semiconductor structure 302, a first gate dielectric layer 304, a first gate conductive layer 306, a second gate dielectric layer 308, a second gate conductive layer 310, a third gate dielectric layer 312, a third gate conductive layer 314, a first source electrode 316, a second source electrode 318, a first drain electrode 320, a second drain electrode 322, an ILD 324, a conductive field plate 326, a first isolation region 328, and a second isolation region 330.

Silicon semiconductor structure 302 includes a base layer 332, an optional p-type or n-type buried layer 334, an n-type layer 336, a first p-type RESURF layer 342, a first p-body region 344, a first source n+ region 346, a second source n+ region 348, a first source p+ region 350, a first drain n+ region 352, a second p-type RESURF layer 358, a second p-body region 360, a third source n+ region 362, a fourth source n+ region 364, a second source p+ region 366, and a second drain n+ region 368. Base layer 332 is, for example, an n-type high-voltage well in a silicon substrate, a p-type silicon substrate, or an n-type epitaxial layer grown over a p-type silicon substrate. Optional buried layer 334 is disposed over base layer 332 in a thickness 370 direction, and n-type layer 336 is disposed over base layer 332 in the thickness 370 direction. In embodiments including optional buried layer 334, this layer is disposed between base layer 332 and n-type layer 336 in the thickness 370 direction.

Each of first and second p-type RESURF layers 342 and 358 are disposed in n-type layer 336. N-type layer 336 includes a first drift region 338, a second drift region 340, a third drift region 354, and a fourth drift region 356. Each of first drift region 338 and third drift region 354 are disposed over base layer 332 in the thickness 370 direction. Second drift region 340 is disposed over first p-type RESURF layer 342 in the thickness 370 direction, such that first p-type RESURF layer 342 separates first drift region 338 from second drift region 340 in the thickness 370 direction. Fourth drift region 356 is disposed over second p-type RESURF layer 358 in the thickness direction, such that second p-type RESURF layer 358 separates third drift region 354 from fourth drift region 356 in the thickness 370 direction. First p-body region 344 is disposed over first p-type RESURF layer 342 in the thickness 370 direction, and second p-body region 360 is disposed over second p-type RESURF layer 358 in the thickness 370 direction.

First source n+ region 346, second source n+ region 348, and first source p+ region 350 are disposed in first p-body region 344, such that first source n+ region 346 is separated from second source n+ region 348 in a lateral 372 direction by first source p+ region 350. Similarly, third source n+ region 362, fourth source n+ region 364, and second source p+ region 366 are disposed in second p-body region 360, such that third source n+ region 362 is separated from fourth source n+ region 364 in the lateral 372 direction by second source p+ region 366. The lateral 372 direction is orthogonal to the thickness 370 direction. First and second source p+ regions 350 and 366 form ohmic contacts between first and second p-body regions 344 and 360, respectively, to help prevent parasitic bipolar junction transistors (not shown) in silicon semiconductor substrate 302 from activating. First and second drain n+ regions 352 and 368 are disposed in n-type layer 336. Each of first and second source p+ regions 350 and 366 has a greater p-type dopant concentration than p-body regions 344 and 360. Each of first, second, third, and fourth source n+ regions 346, 348, 362, and 364, as well as each of first and second drain n+ regions 352 and 368, has a greater n-type dopant concentration than n-type layer 336. One or more regions of silicon semiconductor structure 302 may have a graded dopant concentration without departing from the scope hereof.

The shape and size of the various regions of silicon semiconductor structure 302 can vary without departing from the scope hereof. For example, although the various regions of silicon semiconductor structure 302 are illustrated as having a rectangular shape for illustrative simplicity, the regions will have a rounded or irregular shape in many embodiments.

Figure 5:
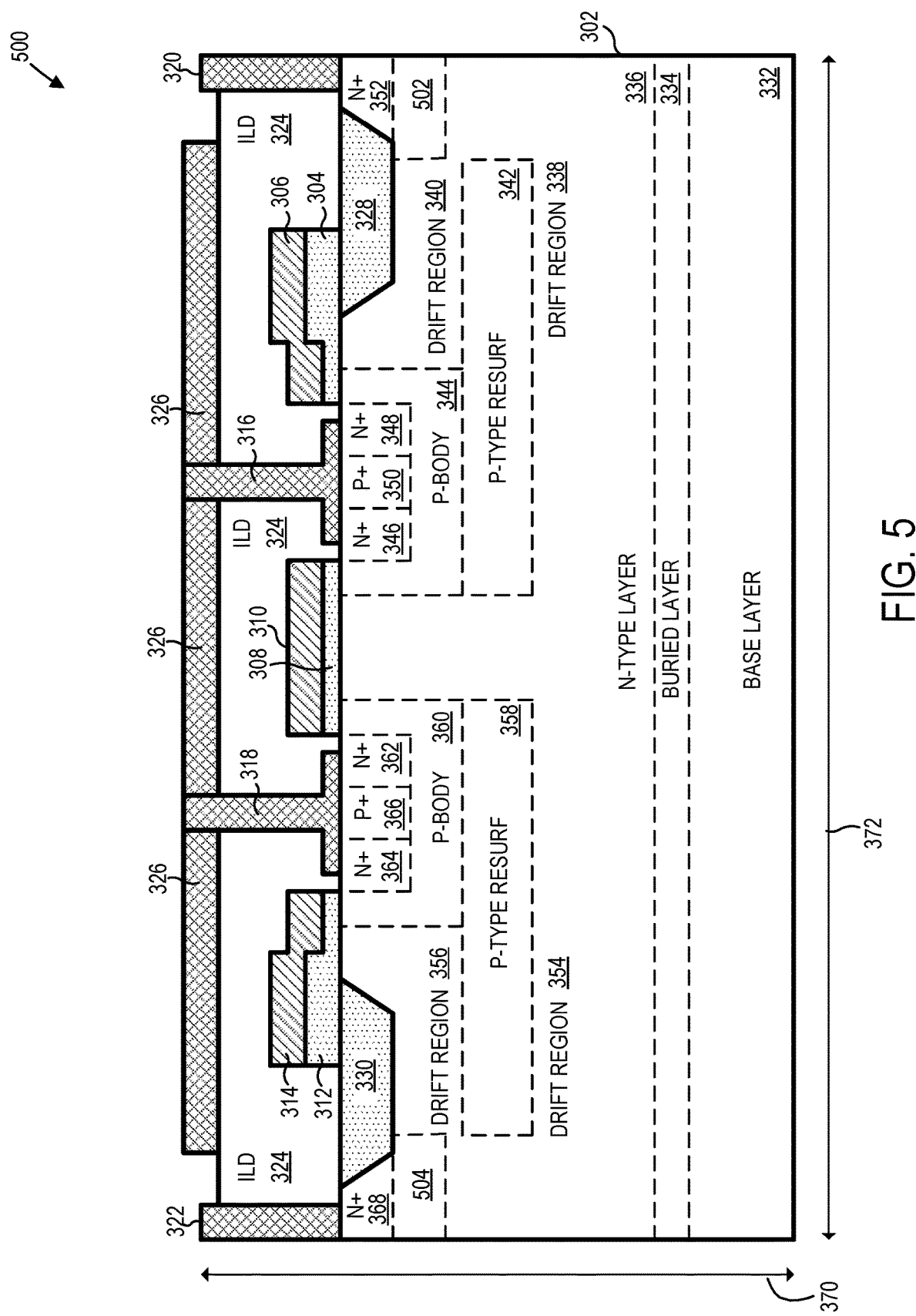
FIG. 5 is a cross-sectional view of a multi-transistor device which is like the FIG. 3 multi-transistor device but further including n-type wells, according to an embodiment.

Furthermore, silicon semiconductor structure 302 may include additional impurity regions without departing from the scope hereof. For example, FIG. 5 is a cross-sectional view analogous to the FIG. 4 cross-sectional view of a multi-transistor device 500, which is like multi-transistor device 300 but where silicon semiconductor structure 302 further includes n-type wells 502 and 504 in n-type layer 336. Each of n-type wells 502 and 504 has a greater n-type dopant concentration than n-type layer 336. First drain n+ region 352 is disposed in n-type well 502, and first drain n+ region 352 has a greater n-type dopant concentration than first n-type well 502. Second drain n+ region 368 is disposed in n-type well 504, and second drain n+ region 368 has a greater n-type dopant concentration than n-type well 504.

Each of first and second isolation regions 328 and 330 (FIGS. 4 and 5) is at least partially recessed in silicon semiconductor structure 302. In some embodiments, each of first and second isolation regions 328 and 330 is an STI region formed by depositing a dielectric material in a trench of silicon semiconductor structure 302. In some other embodiments, each of first and second isolation regions 328 and 330 is a local oxidation of silicon (LOCOS) region. First isolation region 328 is disposed between first p-body region 344 and drain n+ region 352 in the lateral 372 direction, and second isolation region 330 is disposed between second p-body region 360 and drain n+ region 368 in the lateral 372 direction. First isolation region 328 at least partially defines a lateral edge of first drain n+ region 352, and second isolation region 330 at least partially defines a lateral edge of second drain n+ region 368.

First source electrode 316 contacts each of first source n+ region 346, second source n+ region 348, and first source p+ region 350. Second source electrode 318 contacts each of third source n+ region 362, fourth source n+ region 364, and second source p+ region 366. First drain electrode 320 contacts first drain n+ region 352, and second drain electrode 322 contacts second drain n+ region 368. The size, shape, and/or quantity of electrodes in multi-transistor device 302 may be varied without departing from the scope hereof. For example, although first and second drain electrodes 320 and 322 are illustrated as extending along an entire depth 374 of multi-transistor device 300 (FIG. 3), in some alternate embodiments, first and second drain electrodes 320 and 322 only extend along part of depth 374, where the depth 374 direction is orthogonal to each of the thickness 370 and lateral 372 directions. As another example, in some alternate embodiments, each of first and second drain electrodes 320 and 322 is replaced with multiple electrodes. As yet another example, in some alternate embodiments, first source p+ region 350 and second source p+ region 366 contact their own respective electrodes, instead of contacting first source electrode 316 and second source electrode 318, respectively.

First gate dielectric layer 304 and first gate conductive layer 306 are stacked on silicon semiconductor structure 302 in the thickness 370 direction over at least first p-body region 344. Second gate dielectric layer 308 and second gate conductive layer 310 are stacked on silicon semiconductor structure 302 in the thickness 370 direction over at least each of first p-body region 344 and second p-body region 360. Third gate dielectric layer 312 and third gate conductive layer 314 are stacked on silicon semiconductor structure 302 in the thickness 370 direction over at least second p-body region 360. Each of first, second, and third gate dielectric layers 304, 308, and 312 are separated from each other in the lateral 372 direction, and each of first, second, and third gate conductive layers 306, 310, and 314 are separated from each other in the lateral 372 direction. First, second, and third gate dielectric layers 304, 308, and 312 are formed, for example, of silicon dioxide or a high-K dielectric material such as one or more of $HfO_2$, $TiO_2$, $ZrO_2$, and $HfAlO_x$. First, second, and third gate conductive layer 306, 310, and 314 are formed, for example, of polysilicon or metal.

Figure 6:
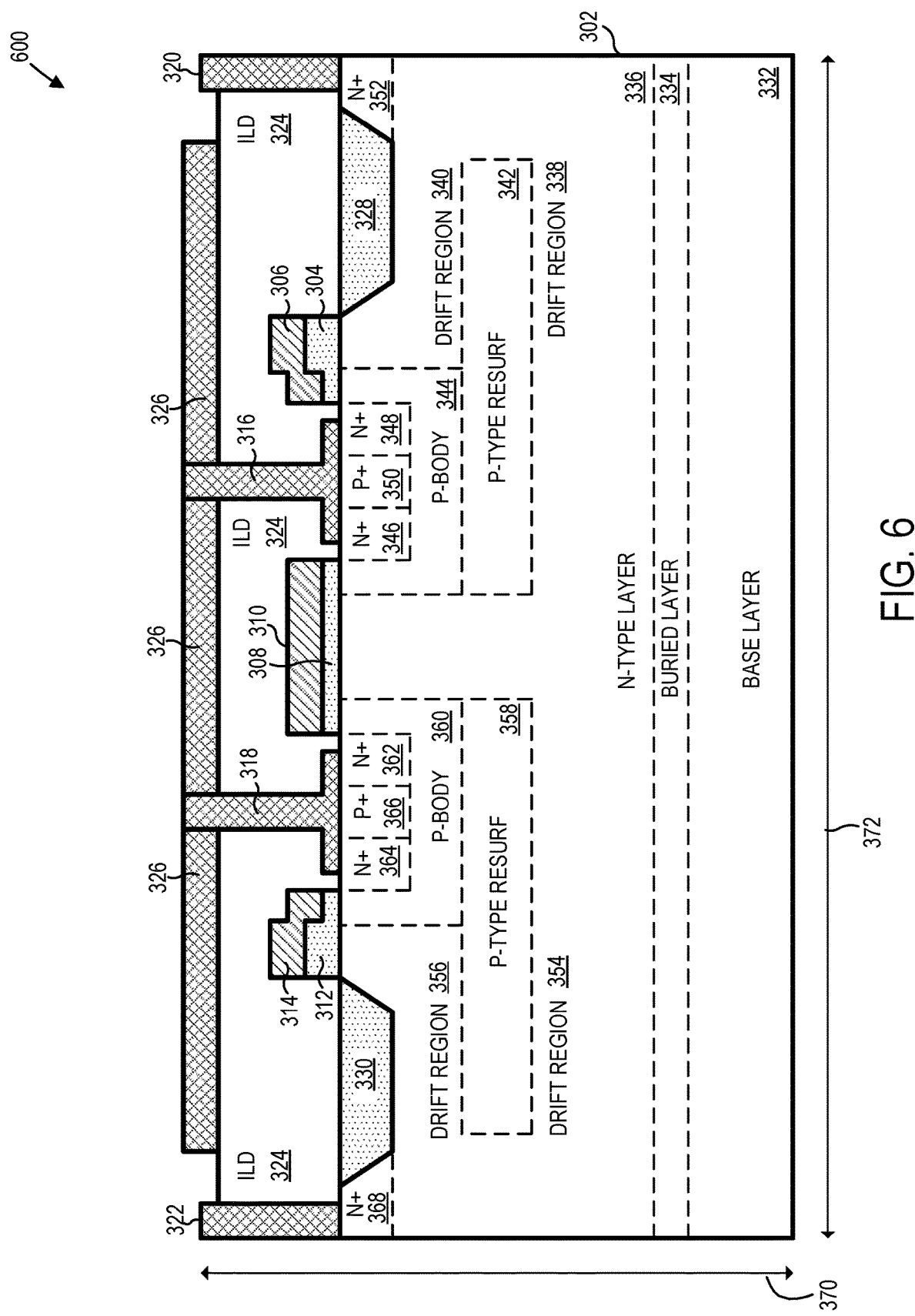
FIG. 6 is a cross-sectional view of a multi-transistor device which is like the FIG. 3 multi-transistor device but where isolation regions are laterally separated from gate conductive layers, according to an embodiment.

First and third gate conductive layers 306 and 314 are illustrated in FIG. 4 as respectively extending over first and second isolation regions 328 and 330 in the thickness 370 direction. In some alternate embodiments, however, first isolation region 328 is separated from first gate conductive layer 306 in the lateral 372 direction, and second isolation region 330 is separated from third gate conductive layer 314 in the lateral 372 direction. Stated differently, in these alternate embodiments, first gate conductive layer 306 does not overlap with first isolation region 328 in the thickness 370 direction, and second gate conductive layer 314 does not overlap with second isolation region 330 in the thickness 370 direction. Applicant has found that this configuration promotes tolerance to any cone-defects which might occur in first and second isolation regions 328 and 330. FIG. 6 is a cross-sectional view of a multi-transistor device 600, which is like multi-transistor device 300, but where first isolation region 328 is separated from first gate conductive layer 306 in the lateral 372 direction, and where second isolation region 330 is separated from third gate conductive layer 314 in the lateral 372 direction ILD 324 is disposed over silicon semiconductor structure 302 in the thickness 370 direction, and conductive field plate 326 is disposed over ILD 324 in the thickness 370 direction (FIGS. 4, 5, and 6). Conductive field plate 326 is disposed over each first, second, third, and fourth drift regions 338, 340, 354, and 356 in the thickness 370 direction. Conductive field plate 326 optionally extends over first and second isolation regions 328 and 330 in the thickness 370 direction, such that conductive field plate 326 is separated from first and second isolation regions 328 and 330 in the thickness 370 direction by ILD 324. In some embodiments, conductive field plate 326 is electrically coupled to first and second source electrodes 316 and 318, as illustrated, such that source regions of LDMOS transistors of multi-transistor device 300 are electrically coupled together. In some other embodiments, conductive field plate 326 is configured to be electrically coupled to an external electrical power source, such as an electrical power source having an electrical potential that is less than that of first and second drain electrodes 320 and 322 during operation of multi-transistor device 300. The shape of conductive field plate 326 can vary without departing from the scope hereof. For example, in some alternative embodiments, conductive field plate 326 does not present a continuous surface but instead forms one or more apertures.

Each of multi-transistor devices 300, 500, and 600 includes four LDMOS transistors. The first LDMOS transistor includes n-type layer 336, first p-type RESURF layer 342, first p-body region 344, first source n+ region 346, first source p+ region 350, first drain n+ region 352, second gate dielectric layer 308, second gate conductive layer 310, first source electrode 316, first drain electrode 320, ILD 324, and conductive field plate 326. The second LDMOS transistor includes n-type layer 336, first p-type RESURF layer 342, first p-body region 344, second source n+ region 348, first source p+ region 350, first drain n+ region 352, first gate dielectric layer 304, first gate conductive layer 306, first source electrode 316, first drain electrode 320, ILD 324, and conductive field plate 326. Thus, the first and second LDMOS transistors share significant elements, including first p-type RESURF layer 342 and first drain n+ region 352.

The third and fourth LDMOS transistors are analogous to the first and second LDMOS transistors, respectively. In particular, the third LDMOS transistor includes n-type layer 336, second p-type RESURF layer 358, second p-body region 360, third source n+ region 362, second source p+ region 366, second drain n+ region 368, third gate dielectric layer 312, third gate conductive layer 314, second source electrode 318, second drain electrode 322, ILD 324, and conductive field plate 326. The fourth LDMOS transistor includes n-type layer 336, second p-type RESURF layer 358, second p-body region 360, fourth source n+ region 364, second source p+ region 366, second drain n+ region 368, third gate dielectric layer 312, third gate conductive layer 314, second source electrode 318, second drain electrode 322, ILD 324, and conductive field plate 326. Thus, the third and fourth LDMOS transistors share significant elements, including second p-type RESURF layer 358 and second drain n+ region 368. The third LDMOS transistor is separated from the first LDMOS transistor in the lateral 372 direction, and the fourth LDMOS transistor is separated from the second LDMOS transistor in the lateral 372 direction.

Figure 7:
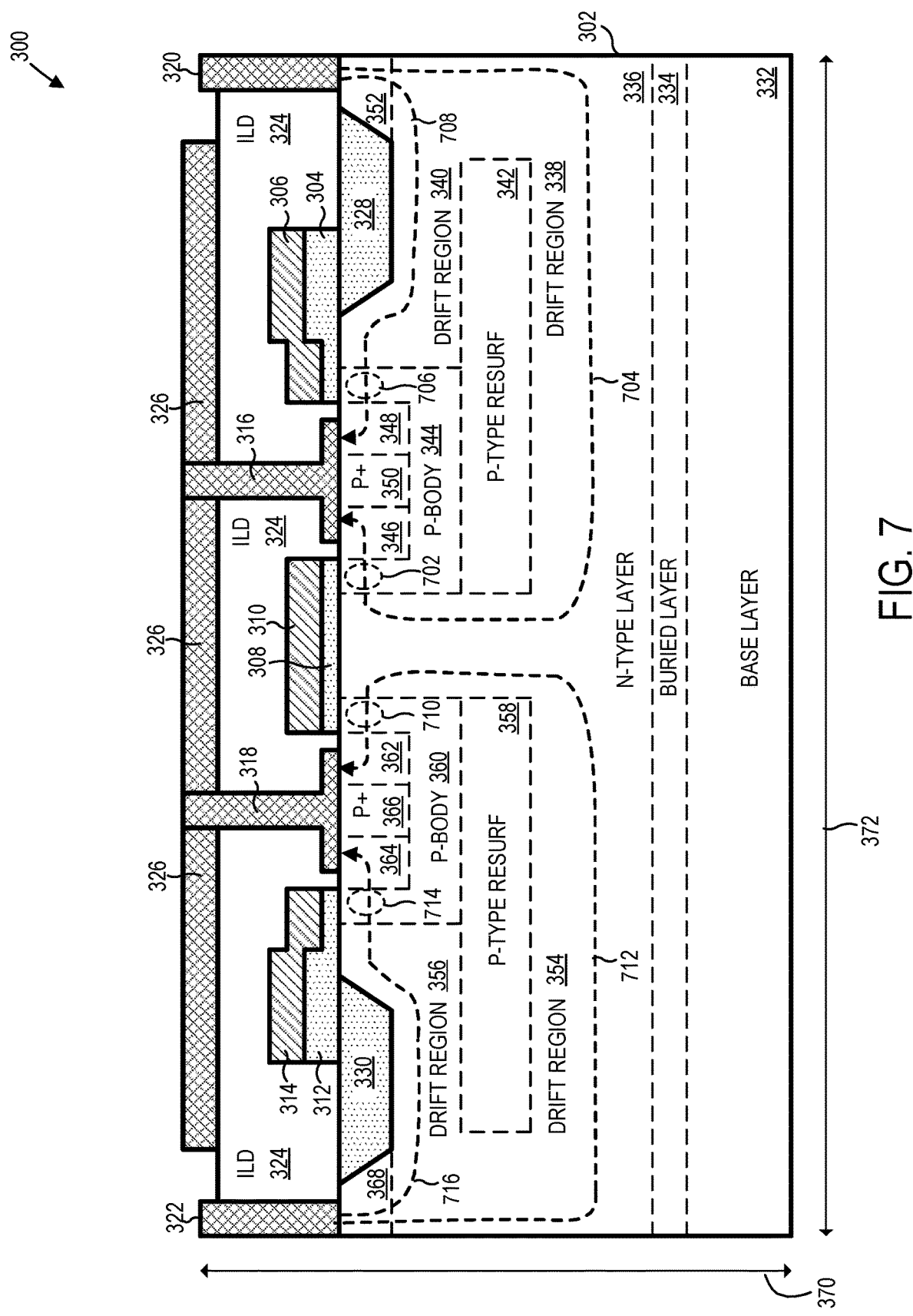
FIG. 7 is a cross-sectional view of the FIG. 3 multi-transistor device marked-up to symbolically show minority-carrier channels and current flow paths of LDMOS transistors of the multi-transistor device, according to an embodiment.

FIG. 7 is a cross-sectional view of multi-transistor device 300 marked-up to symbolically show minority-carrier channels and current flow paths of the four LDMOS transistors of multi-transistor device 300. A positive voltage $V_{GS}$ applied between second gate conductive layer 310 and first source electrode 316 creates negative charges in silicon semiconductor structure 302 under second gate dielectric layer 308, causing a minority-carrier channel to form in a region 702 of first p-body region 344, as illustrated in FIG. 7. This channel has excess electrons and therefore conducts electric current through first p-body region 344 from n-type layer 336 to first source n+ region 346, when a positive voltage $V_{DS}$ is applied across first drain electrode 320 and first source electrode 316. Consequently, drain-to-source current for the first LDMOS transistor flows along a path that extends under first p-type RESURF layer 342 and through first drift region 338, as symbolically shown in FIG. 7 by an arrow 704.

A positive voltage $V_{GS}$ applied between first gate conductive layer 306 and first source electrode 316 creates negative charges in silicon semiconductor structure 302 under first gate dielectric layer 304, causing a minority-carrier channel to form in a region 706 of first p-body region 344. This channel has excess electrons and therefore conducts electric current through first p-body region 344 from n-type layer 336 to second source n+ region 348, when a positive voltage $V_{DS}$ is applied across first drain electrode 320 and first source electrode 316. Consequently, drain-to-source current for the second LDMOS transistor flows along a path that extends over first p-type RESURF layer 342 and through second drift region 340, as symbolically shown in FIG. 7 by an arrow 708.

The third and the fourth LDMOS transistors operate in a manner analogous to that of the first and second LDMOS transistors, respectively. Specifically, a positive voltage $V_{GS}$ applied between second gate conductive layer 310 and second source electrode 318 creates negative charges in silicon semiconductor structure 302 under second gate dielectric layer 308, causing a minority-carrier channel to form in a region 710 of second p-body region 360, as illustrated in FIG. 7. This channel has excess electrons and therefore conducts electric current through second p-body region 360 from n-type layer 336 to third source n+ region 362, when a positive voltage $V_{DS}$ is applied across second drain electrode 322 and second source electrode 318. Consequently, drain-to-source current for the third LDMOS transistor flows along a path that extends under second p-type RESURF layer 358 and through third drift region 354, as symbolically shown in FIG. 7 by an arrow 712.

A positive voltage $V_{GS}$ applied between third gate conductive layer 314 and second source electrode 318 creates negative charges in silicon semiconductor structure 302 under third gate dielectric layer 314, causing a minority-carrier channel to form in a region 714 of second p-body region 360, as illustrated in FIG. 7. This channel has excess electrons and therefore conducts electric current through second p-body region 360 from n-type layer 336 to fourth source n+ region 364, when a positive voltage $V_{DS}$ is applied across second drain electrode 322 and second source electrode 318. Consequently, drain-to-source current for the fourth LDMOS transistor flows along a path that extends over second p-type RESURF layer 358 and through fourth drift region 356, as symbolically shown in FIG. 7 by an arrow 716. In certain embodiments, two or more of first, second, and third gate conductive layers 306, 310, and 314 are electrically coupled together so three or more of the LDMOS transistors in multi-transistor device 300 can be controlled by a common driver.

The four drain-to-source current paths of multi-transistor device 300, as symbolically shown by arrows 704, 708, 712, and 716, enable multi-transistor device 300 to achieve a greater linear current density and a smaller specific ON-resistance than conventional LDMOS multi-transistor devices which typically only have two drain-to-source current paths per unit cell. For example, Applicant has conducted simulations showing that an embodiment of multi-transistor device 300 may achieve a 24% improvement in specific ON-resistance relative to conventional multi-transistor devices. Additionally, simulations have shown that an embodiment of multi-transistor device 300 may achieve a 45% improvement in the product of ON-resistance and switching energy, relative to conventional multi-transistor devices. Thus, the new multi-transistor devices disclose herein may achieve significant advantages over conventional multi-transistor devices.

Figure 8:
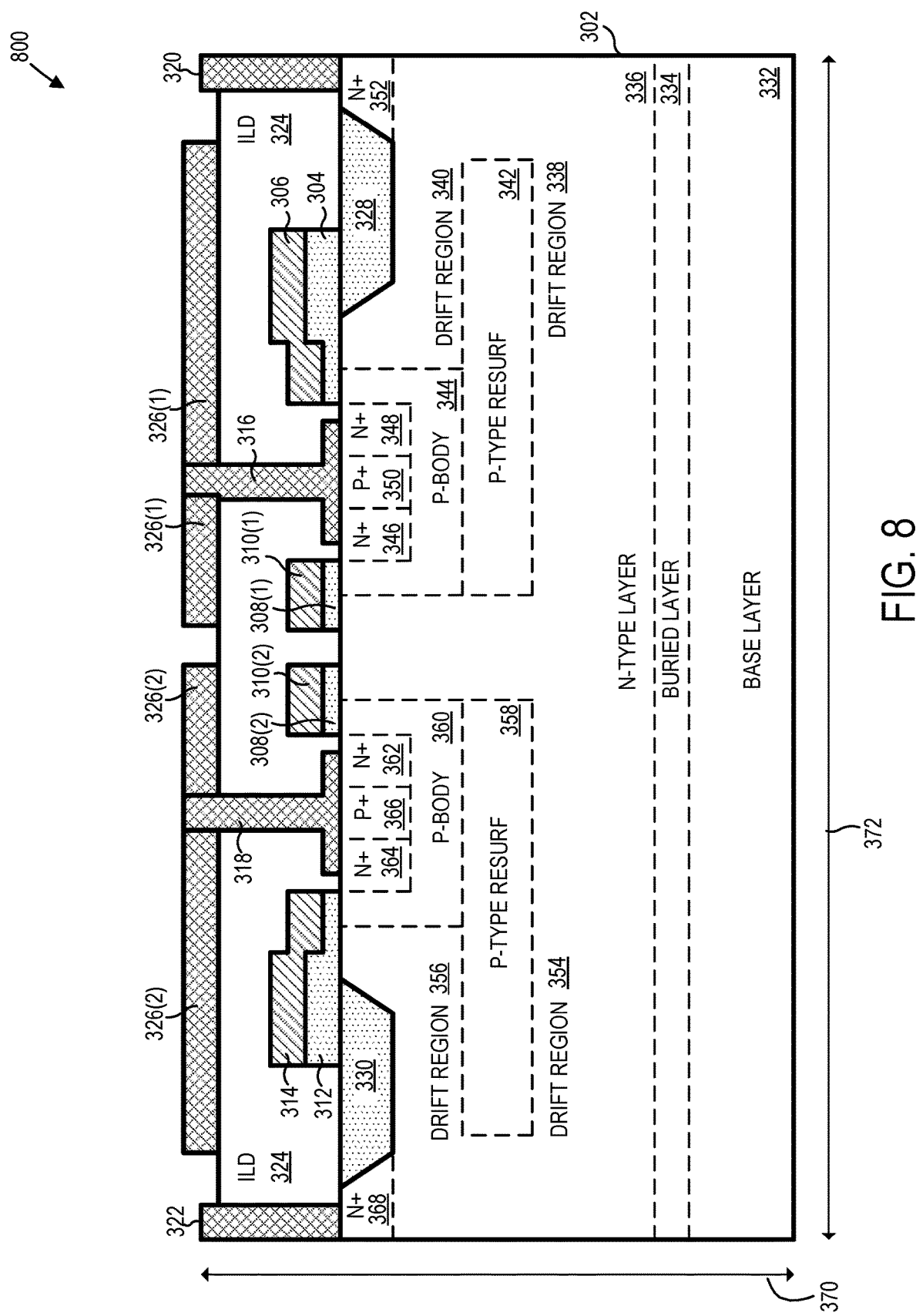
FIG. 8 is a cross-sectional view of a multi-transistor device which is like the FIG. 3 multi-transistor device but where a gate isolation layer and a gate conductive layer are laterally split, according to an embodiment.

The configuration of the multi-transistor devices disclosed herein can be varied without departing from the scope hereof. For example, multi-transistor device 300 can be modified to further include spacer regions around one or more of gate conductive layers 306, 310, and 314. As another example, the elements of multi-transistor device 300 can be replicated one or more times to form a multi-transistor device including eight or more LDMOS transistors. As yet another example, second gate dielectric layer 308 and second gate conductive layer 310 could be laterally split so that gates of the first and third LMDOS transistors are individually controllable. For example, FIG. 8 is a cross-sectional view analogous to the FIG. 4 cross-sectional view of a multi-transistor device 800 which is like multi-transistor device 300 but where (a) second gate dielectric layer 308 is laterally split into two separate sections 308(1) and 308(2) and (b) second gate conductive layer 310 is laterally split into two separate sections 310(1) and 310(2). Conductive field plate 316 is also optionally split into separate sections 326(1) and 326(2), as illustrated in FIG. 8.

Figure 9:
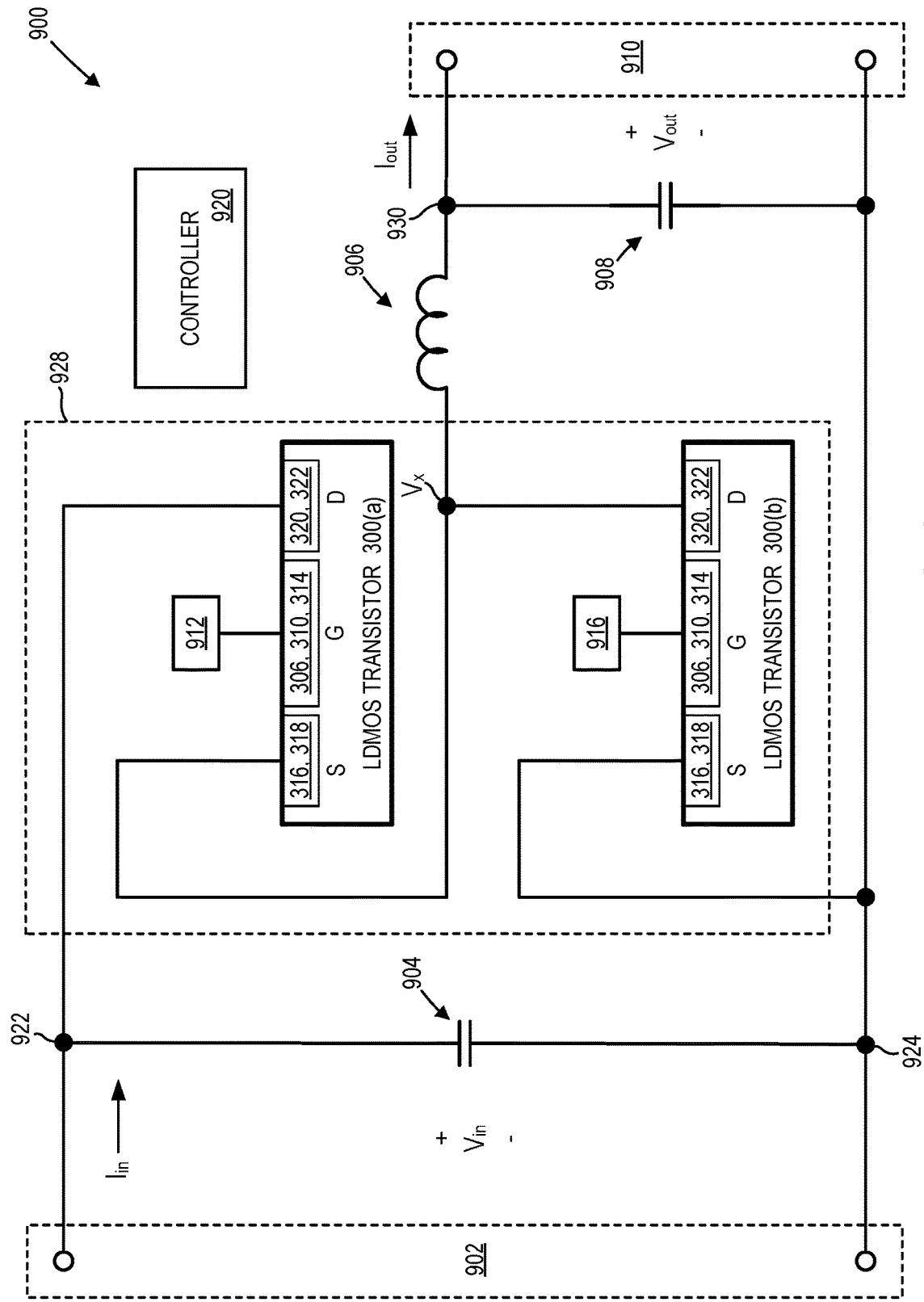
FIG. 9 schematically illustrates a buck converter including two instances of the FIG. 3 multi-transistor device, according to an embodiment.

One possible application of the multi-transistor devices discussed above is in a switching power converter. For example, FIG. 9 schematically illustrates a buck converter 900 including two instances of multi-transistor device 300, hereinafter referred to as multi-transistor device 300(*a*) and multi-transistor device 300(*b*). Multi-transistor devices 300 (*a*) and 300(*b*) are schematically illustrated in FIG. 9 to promote illustrative clarity. Buck converter 900 further includes an input port 902 electrically coupled to an input power source (not shown), an input capacitor 904, an inductor 906, an output capacitor 908, an output port 910 electrically coupled to a load (not shown), first driver circuitry 912, second driver circuitry 916, and a controller 920.

Input port 902 is electrically coupled across a positive input node 922 and a reference node 924. Input capacitor 904 is electrically coupled across positive input node 922 and reference node 924, and input capacitor 904 provides a path for input ripple current drawn by buck converter 900. Drain electrodes 320 and 322 of multi-transistor device 300(a) are electrically coupled to positive input node 922, and source electrodes 316 and 318 of multi-transistor device 300(a) are electrically coupled to a switching node $V_x$. Gate conductive layers 306, 310, and 314 are electrically coupled to first driver circuitry 912. Thus, the four LDMOS transistors of multi-transistor device 300(a) are electrically coupled in parallel.

Drain electrodes 320 and 322 of multi-transistor device 300(b) are electrically coupled to switching node $V_x$, and source electrodes 316 and 318 of multi-transistor device 300(b) are electrically coupled to reference node 924. Gate conductive layers 306, 310, and 314 of multi-transistor device 300(b) are electrically coupled to second driver circuitry 916. Thus, the four LDMOS transistors of multi-transistor device 300(b) are electrically coupled in parallel.

Multi-transistor devices 300(a) and 300(b), first driver circuitry 912, and second driver circuitry 916 collectively form a switching circuit 928. Inductor 906 is electrically coupled between switching node $V_x$ and a positive output node 930, and output port 910 is electrically coupled across positive output node 930 and reference node 924. Output capacitor 908 is electrically coupled across positive output node 930 and reference node 924, and output capacitor 908 provides a path for output ripple current generated by buck converter 900.

Controller 920 controls switching of switching circuit 928 to transfer power from the power source (electrically coupled to input port 902) to the load (electrically coupled to output port 910). In particular, controller 920 controls first driver circuitry 912 to repeatedly switch gate conductive layers 306, 310, and 314 of multi-transistor device 300(a) between two different voltage magnitudes, to cause the LDMOS transistors of multi-transistor device 300(a) to repeatedly switch between their conductive and non-conductive states under the control of controller 920. Controller 920 also controls second driver circuitry 916 to repeatedly switch gate conductive layers 306, 310, 314 of multi-transistor device 300(b) between two different voltage magnitudes to cause the LDMOS transistors of multi-transistor device 300(b) to repeatedly switch between their conductive and non-conductive states. Controller 920 controls switching of multi-transistor device 300(b) such that it performs a freewheeling function, or in other words, such that multi-transistor device 300(b) provides a path for current flowing through inductor 906 when the LDMOS transistors of multi-transistor device 300(b) are in their non-conductive states. In some embodiments, controller 920 controls switching of switching circuit 928 to regulate one or more parameters of buck converter 900, such as input voltage $V_{in}$, input current $I_{in}$, input power $P_{in}$, output voltage $V_{out}$, output current $I_{out}$, and output power $P_{out}$. Connections between controller 920 and other components of buck converter 900 are not shown to promote illustrative clarity.

It should be appreciated that the multi-transistor devices discussed above are not limited to use in a buck converter, or even to use in a switching power converter. For example, multi-transistor device 300 could alternately be used in an amplifier.

Combinations of Features

Features described above may be combined in various ways without departing from the scope hereof. The following examples illustrate some possible combinations:

(A1) A multi-transistor device may include first and second lateral double-diffused metal-oxide-semiconductor field effect (LDMOS) transistors sharing a first p-type reduced surface field (RESURF) layer and a first drain n+ region.

(A2) The multi-transistor device denoted as (A1) may further include third and fourth LDMOS transistors sharing a second p-type RESURF layer and a second drain n+ region.

(A3) In the multi-transistor device denoted as (A2), a source region of the first LMDOS transistor may be electrically coupled to a source region of the third LDMOS transistor.

(A4) In any one of the multi-transistor devices denoted as (A2) and (A3), the first LDMOS transistor may be separated from the third LDMOS transistor in a lateral direction, and the second LDMOS transistor may be separated from the fourth LDMOS transistor in the lateral direction.

(A5) In any one of the multi-transistor devices denoted as (A1) through (A4), the first LDMOS transistor may include a first drift region, the second LDMOS transistor may include a second drift region, and the first and second drift regions may be at least partially separated by the first p-type RESURF layer in a thickness direction.

(A6) In the multi-transistor device denoted as (A5), the first and second LDMOS transistors may share a p-body region, the first LDMOS transistor may include a first source n+ region disposed in the p-body region, the second LDMOS transistor may include a second source n+ region disposed in the p-body region, and the first and second LDMOS transistors may share a source p+ region disposed in the p-body region.

(A7) In the multi-transistor device denoted as (A6), each of the first p-type RESURF layer, the first drain n+ region, the first drift region, the second drift region, the first source n+ region, the second source n+ region, and the source p+ region may be part of a silicon semiconductor structure.

(A8) In the multi-transistor device denoted as (A7), the first source n+ region may be separated from the second source n+ region by the source p+ region.

(A9) In any one of the multi-transistor devices denoted as (A7) and (A8), the first p-type RESURF layer may adjoin the p-body region in the thickness direction.

(A10) Any one of the multi-transistor devices denoted as (A7) through (A9) may further include (1) a first gate conductive layer and a first gate dielectric layer stacked on the silicon semiconductor structure in the thickness direction over the p-body region and (2) a second gate conductive layer and a second gate dielectric layer stacked on the silicon semiconductor structure in the thickness direction over the p-body region, where (i) first gate dielectric layer may be separated from the second gate dielectric layer in a lateral direction, the lateral direction being orthogonal to the thickness direction, and (ii) the first gate conductive layer may be separated from the second gate conductive layer in the lateral direction.

(A11) The multi-transistor device denoted as (A10) may further include a shallow trench isolation (STI) region disposed in a trench in the silicon semiconductor structure, the STI region being disposed between the p-body region and the first drain n+ region in the lateral direction.

(A12) In the multi-transistor device denoted as (A11), the first gate conductive layer may extend at least partially over the STI region in the thickness direction.

(A13) Any one of the multi-transistor devices denoted as (A11) and (A12) may further include (1) an inner-layer dielectric (ILD) disposed over the silicon semiconductor structure in the thickness direction and (2) a conductive field plate disposed over the ILD in the thickness direction.

(A14) In the multi-transistor device denoted as (A13), the conductive field plate may be disposed at least partially over the STI region in the thickness direction.

(A15) In any one of the multi-transistor devices denoted as (A13) and (A14), the conductive field plate may be electrically coupled to the first source n+ region, the second source n+ region, and the source p+ region.

(A16) Any one of the multi-transistor devices denoted as (A7) through (A15) may further include (1) a source electrode disposed over the silicon semiconductor structure and contacting each of the first source n+ region, the second n+ region, and the source p+ region and (2) a drain electrode disposed over the silicon semiconductor structure and contacting the first drain n+ region.

(B1) A multi-transistor device may include a silicon semiconductor structure, including (1) a base layer, (2) a first n-type drift region disposed over the base layer in a thickness direction, (3) a p-type reduced surface field (RESURF) layer disposed over the first n-type drift region in the thickness direction, (4) a second n-type drift region disposed over the p-type RESURF layer in the thickness direction, (5) a p-body region disposed over the p-type RESURF layer in the thickness direction, (6) first and second source n+ regions disposed in the p-body region, and (7) a drain n+ region. The multi-transistor device may further include (1) a first gate conductive layer and a first gate dielectric layer stacked on the silicon semiconductor structure in the thickness direction over the p-body region and (2) a second gate conductive layer and a second gate dielectric layer stacked on the silicon semiconductor structure in the thickness direction over the p-body region.

(B2) In the multi-transistor device denoted as (B1), the silicon semiconductor structure may further include a source p+ region disposed in the p-body region, the source p+ region may separate the first and second source n+ regions in a lateral direction, the lateral direction being orthogonal to the thickness direction.

(B3) In the multi-transistor device denoted as (B2), the drain n+ region may be separated from the p-body region in the lateral direction.

(B4) Any one of the multi-transistor devices denoted as (B2) and (B3) may include a shallow trench isolation (STI) region disposed in a trench in the silicon semiconductor structure, the STI region being disposed between the p-body region and the drain n+ region in the lateral direction.

(B5) In the multi-transistor device denoted as (B4), the first gate conductive layer may extend at least partially over the STI region in the thickness direction.

(B6) Any one of the multi-transistor devices denoted as (B4) and (B5) may further include (1) an inner-layer dielectric (ILD) disposed over the silicon semiconductor structure in the thickness direction and (2) a conductive field plate disposed over the ILD in the thickness direction.

(B7) In the multi-transistor device denoted as (B6), the conductive field plate may be disposed at least partially over the STI region in the thickness direction.

(B8) In any one of the multi-transistor devices denoted as (B6) and (B7), the conductive field plate may be electrically coupled to the first source n+ region, the second source n+ region, and the source p+ region.

(B9) Any one of the multi-transistor devices denoted as (B1) through (B8) may further include (1) a source electrode disposed over the silicon semiconductor structure and contacting each of the first source n+ region, the second n+ region, and the source p+ region and (2) a drain electrode disposed over the silicon semiconductor structure and contacting the drain n+ region.

Changes may be made in the above-discussed multi-transistor devices without departing from the scope hereof. For example, the multi-transistor devices discussed above could be modified to include p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present multi-transistor devices, which, as a matter of language, might be said to fall therebetween.

What is claimed is:

1. A multi-transistor device, comprising: first and second lateral double-diffused metal-oxide-semiconductor field effect (LDMOS) transistors sharing a first p-type reduced surface field (RESURF) layer and a first drain n+ region, a source p+ region, a first gate conductive layer, a p-body region, and a shallow trench isolation (STI) region, wherein;
    the first LDMOS transistor includes a first drift region,
    the second LDMOS transistor includes a second drift region,
    the first and second drift regions are at least partially separated by the first p-type RESURF layer in a thickness direction,
    the source p+ region is directly above the p-body region in the thickness direction,
    the first gate conductive layer is between the first drain n+ region and the source p+ region in a lateral direction orthogonal to the thickness direction,
    the STI region is between the first gate conductive layer and the first drain n+ region; and
    the first gate conductive layer does not overlap with the STI region in the thickness direction.

2. The multi-transistor device of claim 1, further comprising third and fourth LDMOS transistors sharing a second p-type RESURF layer and a second drain n+ region.

3. The multi-transistor device of claim 2, wherein the common source region of the first LMDOS transistor is electrically coupled to a source region of the third LDMOS transistor.

4. The multi-transistor device of claim 2, wherein:
    the first LDMOS transistor is separated from the third LDMOS transistor in the lateral direction; and
    the second LDMOS transistor is separated from the fourth LDMOS transistor in the lateral direction.

5. The multi-transistor device of claim 4, wherein:
    the first and second LDMOS transistors share the p-body region;
    the first LDMOS transistor includes a first source n+ region disposed in the p-body region;
    the second LDMOS transistor includes a second source n+ region disposed in the p-body region; and
    the first and second LDMOS transistors share the source p+ region disposed in the p-body region.

6. The multi-transistor device of claim 5, wherein each of the first p-type RESURF layer, the first drain n+ region, the first drift region, the second drift region, the first source n+ region, the second source n+ region, and the source p+ region are part of a silicon semiconductor structure.

7. The multi-transistor device of claim 6, wherein the first source n+ region is separated from the second source n+ region by the source p+ region.

8. The multi-transistor device of claim 6, wherein the first p-type RESURF layer adjoins the p-body region in the thickness direction.

9. The multi-transistor device of claim 7, further comprising:
   an inner-layer dielectric (ILD) disposed over the silicon semiconductor structure in the thickness direction; and
   a conductive field plate disposed over the ILD in the thickness direction.

10. The multi-transistor device of claim 9, wherein the conductive field plate is disposed at least partially over the STI region in the thickness direction.

11. The multi-transistor device of claim 9, wherein the conductive field plate is electrically coupled to the first source n+ region, the second source n+ region, and the source p+ region.

12. The multi-transistor device of claim 6, further comprising:
   a source electrode disposed over the silicon semiconductor structure and contacting each of the first source n+ region, the second n+ region, and the source p+ region; and
   a drain electrode disposed over the silicon semiconductor structure and contacting the first drain n+ region.

\* \* \* \* \*